United States Patent
Qiu et al.

(10) Patent No.: US 8,072,200 B1
(45) Date of Patent: Dec. 6, 2011

(54) AC AND DC TEMPERATURE COMPENSATION SCHEME FOR DCR CURRENT SENSE

(75) Inventors: Weihong Qiu, San Jose, CA (US); Shangyang Xiao, Sunnyvale, CA (US); Kun Xing, Cary, NC (US)

(73) Assignee: Intersil Americas Inc., Milpitas, CA (US)

( * ) Notice: Subject to any disclaimer, the term of this patent is extended or adjusted under 35 U.S.C. 154(b) by 530 days.

(21) Appl. No.: 12/339,500

(22) Filed: Dec. 19, 2008

Related U.S. Application Data

(60) Provisional application No. 61/015,859, filed on Dec. 21, 2007.

(51) Int. Cl.
G05F 1/40 (2006.01)
(52) U.S. Cl. .................... 323/282; 323/285; 323/907
(58) Field of Classification Search .......... 323/271, 323/275, 277, 282–285, 288, 290
See application file for complete search history.

(56) References Cited

U.S. PATENT DOCUMENTS

| | | | | |
|---|---|---|---|---|
| 5,790,430 | A * | 8/1998 | Steiert | 340/648 |
| 6,583,610 | B2 * | 6/2003 | Groom et al. | 323/288 |
| 7,193,410 | B2 * | 3/2007 | Patel et al. | 324/762.09 |
| 7,262,628 | B2 * | 8/2007 | Southwell et al. | 323/266 |
| 7,492,134 | B2 * | 2/2009 | Tang et al. | 323/241 |
| 2006/0061339 | A1 * | 3/2006 | Lewis et al. | 323/237 |
| 2009/0140706 | A1 * | 6/2009 | Taufik et al. | 323/272 |
| 2010/0033153 | A1 * | 2/2010 | Xing et al. | 323/288 |
| 2010/0320983 | A1 * | 12/2010 | Wu | 323/283 |

* cited by examiner

*Primary Examiner* — Adolf Berhane
(74) *Attorney, Agent, or Firm* — Gary R. Stanford

(57) ABSTRACT

A current sensing circuit with AC and DC temperature compensation for sensing current through an output inductor which has an inherent DC resistor with a temperature varying resistance. A first RC circuit is coupled across the output inductor and has a time constant. The first amplifier provides a sense signal indicative of voltage of the first RC circuit. The second RC circuit is coupled to a first correction node and receives the sense signal. The second resistor has a temperature varying resistance so that the second RC circuit has a time constant commensurate with a time constant of the output inductor. The third RC circuit is coupled to a second correction node and has a time constant equal commensurate with the first RC circuit. The second amplifier provides a corrected sense signal based on the correction nodes.

21 Claims, 4 Drawing Sheets

AC AND DC TEMPERATURE COMPENSATION SCHEME FOR DCR CURRENT SENSE

CROSS-REFERENCE TO RELATED APPLICATIONS

This application claims the benefit of U.S. Provisional Application Ser. No. 61/015,859, filed on Dec. 21, 2007, which is herein incorporated by reference for all intents and purposes.

BRIEF DESCRIPTION OF THE DRAWINGS

The benefits, features, and advantages of the present invention will become better understood with regard to the following description, and accompanying drawings in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

It is desired to accurately sense the inductor current of each phase for loadline and current sharing purposes in voltage regulator applications including multiphase voltage regulators. In one existing scheme a resistor-capacitor (RC) circuit is coupled across the output inductor (L) used to measure the voltage drop across the inherent DC resistance (DCR) of the output inductor. The DCR has a temperature coefficient, denoted DCR(T), meaning that its value is a function of temperature (T). In one embodiment, DCR(T) is positive such that its resistance increases with increasing temperature. A negative temperature coefficient (NTC) resistor has been used in conventional circuits in an attempt to cancel the DC impact of the DCR change with temperature. The AC impact of the temperature variation, however, has been ignored in the conventional configurations. In this manner, the time constant L/DCR(T) of the output inductor (with inductance L) is not cancelled under all operational temperature conditions. Thus, there exists some difference between the sensed current signal and the real current during transient events in the voltage regulator. In the conventional configuration, DCR is smaller in cooler operating conditions causing undesirable overshoot and undershoot in response to transient events.

Figure 1:
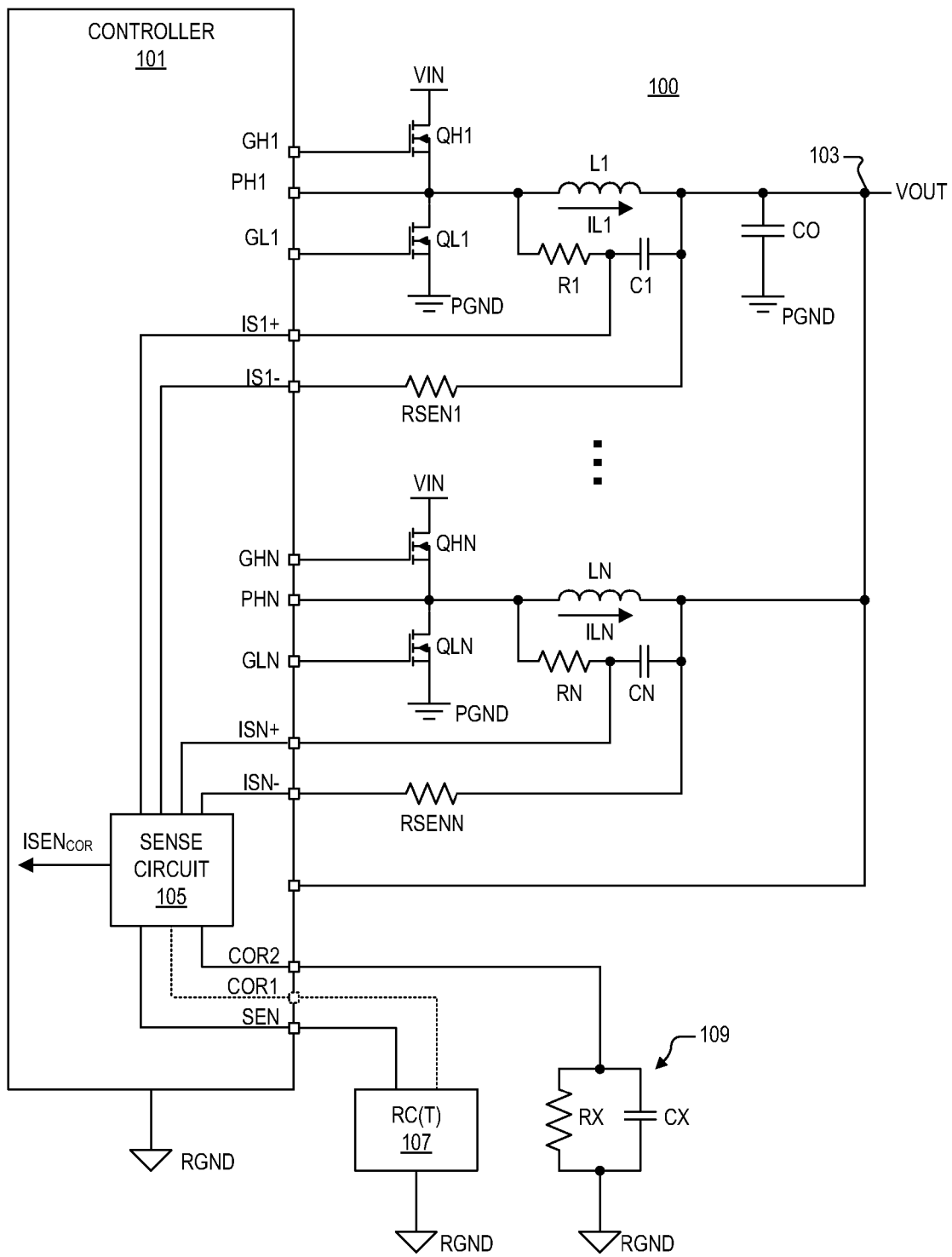
FIG. 1 is a simplified schematic and block diagram of a multiphase voltage regulator including a current sense scheme according to one embodiment to provide both AC and DC temperature compensation.

FIG. 1 is a simplified schematic and block diagram of a multiphase voltage regulator 100 including a current sense scheme according to one embodiment to provide both AC and DC temperature compensation. The voltage regulator 100 includes a controller 101 for controlling "N" power phases (in which N is a positive integer) for converting an input voltage VIN to an output voltage VOUT developed on an output node 103. The controller 101 is referenced to a signal ground (RGND) whereas each of the N power phase circuits are referenced to a separate power ground (PGND) as understood by those skilled in the art. An output capacitor CO is coupled between the output node 103 and PGND. Each of the power phase circuits are configured in similar manner. In the first power phase circuit, VIN is provided to the drain of a high side electronic switch QH1 which has its source coupled to a first phase node PH1. In the illustrated embodiment, PH1 is provided to an input of the controller 101. A lower electronic switch QL1 has its drain coupled to PH1 and its source coupled to PGND. The controller 101 provides a high gate control signal GH1 to the gate of QH1 and a low gate control signal GL1 to the gate of QL1. The first power phase circuit includes a first output inductor L1 coupled between PH1 and the output node 103 and the first output inductor L1 develops a current IL1. In the last power phase circuit, VIN is provided to the drain of an upper electronic switch QHN which has its source coupled to a phase node PHN, which is provided to an input of the controller 101. A lower electronic switch QLN has its drain coupled to PHN and its source coupled to PGND. The controller 101 provides a high gate control signal GHN to the gate of QHN and a low gate control signal GLN to the gate of QLN. The last power phase circuit includes an output inductor LN coupled between PHN and the output node 103 and the last output inductor LN develops a current ILN.

Although only two power phase circuits 1 and N are shown, it is understood that any number of power phase circuits may be implemented. It is further noted that the present invention is equally applicable to a single-phase power regulator. The electronic switches QH1, QL1, . . . , QHN, QLN are each depicted as N-channel metal-oxide-semiconductor, field-effect transistor (MOSFET) devices having their drain-source current paths coupled in series between VIN and PGND. Other types of electronic switching devices are contemplated, such as P-channel switches or MOS-type switches or the like. In one embodiment, the controller 101 incorporates driver circuitry or the like for each phase to drive the upper and lower gate signals GHi and GLi (in which "i" is an index from 1 to N representing a given power phase circuit) to turn on and off the corresponding electronic switches QHi and QLi. In an alternative embodiment, the controller 101 provides corresponding pulse width modulation (PWM) signals (not shown) to corresponding driver circuits (not shown) for driving the electronic switches for each phase. In operation, the controller 101 asserts the upper drive signal GHi high to activate the corresponding phase circuit and then asserts GHi low and asserts GLi high to de-activate the corresponding phase circuit. For example, the controller 101 asserts GH1 high to turn on QH1 which effectively couples VIN to L1 via the phase node PH1 during a portion of the PWM cycle. The controller 101 then asserts QH1 low and asserts GL1 high to turn QL1 on which effectively couples PGND to L1 via the phase node PH1. The controller 101 operates each phase in similar manner. In one embodiment, the controller 101 activates each of the power phase circuits one at a time in round-robin fashion or the like. In an alternative embodiment, multiple phase circuits may be active at any one time depending upon the particular control configuration.

As noted above, it is desired to accurately sense the inductor current ILi of each phase for loadline and current sharing purposes or the like. In the first phase circuit, an RC circuit including a resistor R1 and a capacitor C1 is coupled to the first inductor L1. As shown, R1 has one end coupled to PH1 at one end of the inductor L2, and the other end of the resistor R1 is coupled to one end of a corresponding capacitor C1. The other end of the capacitor C1 is coupled to the other end of the inductor L1 at the output node 103. The intermediate junction between R1 and C1 is coupled to a positive current sense pin IS1+ of the controller 101. It is noted that pin names are the same as the corresponding signal or node names unless otherwise specified (e.g., pin IS1+ develops a signal IS1+ on a node IS1+). The other end of the capacitor C1 is coupled to one end of a sense resistor RSEN1, which has its other end coupled to a negative current sense pin IS1+ of the controller 101. Each phase circuit is configured in substantially the same manner with a corresponding RC circuit. As shown for the last phase circuit N, for example, a resistor RN and a capacitor CN are coupled in series across the output inductor LN. The intermediate junction of RN and CN is coupled to a positive current sense pin ISN+ of the controller 101, and the other end of the capacitor CN is coupled to one end of another sense resistor RSENN. The other end of the resistor RSENN is coupled to a negative current sense pin ISN− of the controller 101. In an alternative embodiment, each of the sense resistors RSENi may be incorporated within the controller 101.

The controller 101 internally includes a sense circuit 105 which is coupled to each of the positive and negative current sense pins ISi+ and ISi− of the power phase circuits. The sense circuit 105 is also coupled to a sense pin SEN externally coupled to an RC circuit 107 referenced to RGND. The RC circuit 107 also has a temperature coefficient, denoted RC(T), such that its "value" or time constant is a function of temperature (T). The sense circuit 105 is further coupled to a correction pin COR2, which is further coupled to another RC circuit 109 referenced to RGND. In the illustrated embodiment, the RC circuit 109 includes a resistor RX and a capacitor CX coupled in parallel between COR2 and RGND. In one embodiment no additional pins are provided. In another embodiment, as illustrated using dashed lines, the sense circuit 105 is further coupled to another correction pin COR1 which is further coupled to the RC circuit 107 as further described below.

The time constant of the RC circuits coupled to each of the output inductors Li are approximately equal and are further equal to the time constant of the RC circuit 109. In particular, $R1*C1 \approx R2*C2$ (for phase 2, not shown) $\approx \ldots \approx RN*CN \approx RX*CX$ (in which an asterisk "*" denotes multiplication). It is noted that the resistances of resistors, capacitance of capacitors and inductance of inductors are the same as the component name unless otherwise specified. Thus, for example, the resistor R1 has a resistance R1, the capacitor C1 has a capacitance C1, the inductor L1 has an inductance L1, etc. Although the resistances of the resistors R1, R2, . . . , RN and RX may be equal to each other, they may also be different as long as the capacitances of the corresponding capacitors C1, C2, . . . , CN and CX are adjusted accordingly to maintain approximately equal time constants. Also, the particular time constant may be any convenient value and does not necessarily be the same as the time constant of the inductors Li as further described below.

The sense circuit 105 develops a sense signal on the SEN pin based on the ISi+ and ISi− signals from the power phase circuits and applies the sense signal to the RC circuit 107. The particular type of sense signal on the SEN pin depends upon the particular embodiment of the sense circuit 105. Each of the output inductors Li has an inherent DC resistance DCR with a temperature coefficient, denoted DCR(T), which modifies the corresponding ISi+/− signals accordingly. For convenience and simplicity, the inductance (L) and inherent DC resistance DCR(T) of each of the inductors Li are assumed to be approximately equal. The RC circuit 107 is configured with an opposite temperature coefficient RC(T) as each of the inductors Li so that the value (or time constant) of RC(T) is also modified with temperature in such a manner as to compensate for the temperature coefficient of the inductors Li. In one embodiment, the RC circuit 107 adjusts the sense signal on the SEN pin according to temperature and the sense circuit 105 correspondingly adjusts COR2 applied to the RC circuit 109. In another embodiment, the RC circuit 107 provides a signal on the COR1 pin in response to the sense signal provided on the SEN pin and the sense circuit 105 correspondingly adjusts COR2 applied to the RC circuit 109. In either case, the sense circuit 105 applies the adjustment to develop a corrected current sense signal $ISEN_{COR}$ which is temperature-compensated for both AC and DC conditions.

Figure 2:
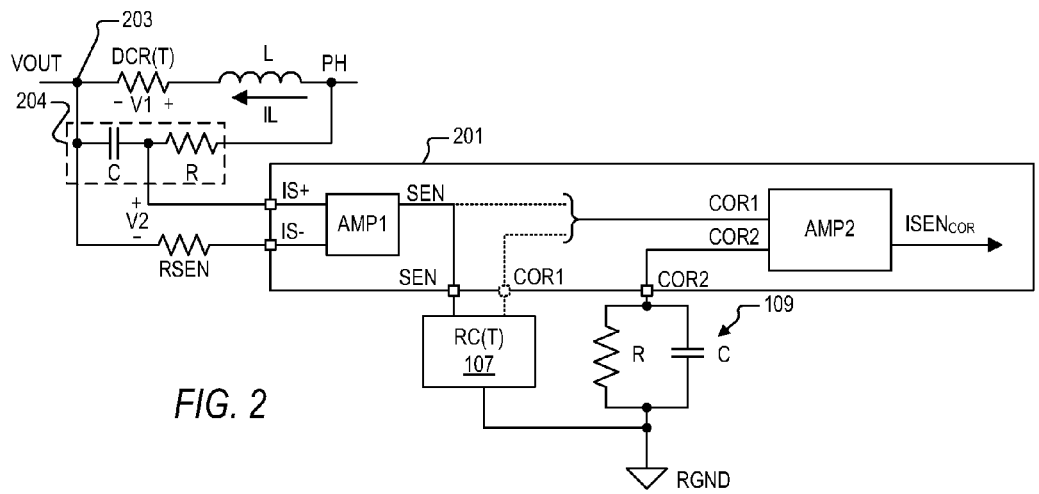
FIG. 2 is a simplified schematic and block diagram of a voltage regulator including a current sense scheme according to one embodiment to provide both AC and DC temperature compensation illustrating a more detailed scheme of the controller.

FIG. 2 is a simplified schematic and block diagram of a voltage regulator 200 including a current sense scheme according to one embodiment to provide both AC and DC temperature compensation. The voltage regulator 200 is shown with a single phase although it is understood that the voltage regulator 200 generically represents a single-phase voltage regulator or a multiphase voltage regulator with any number of phases (2 or more) as understood by those skilled in the art. The sole power phase circuit is generically shown as an output inductor L coupled between a phase node PH and an output node 203 developing an output voltage VOUT. The inductor L develops a current IL and further includes an inherent DC resistance (DCR) having a temperature coefficient, denoted DCR(T). The inherent DC resistance of the inductor L is shown as a separate resistor DCR(T) developing a voltage V1, where it is understood that the resistor DCR(T) is not a separate resistor but is incorporated within or otherwise represents the resistance of the windings of the inductor L. An RC circuit 204 including a resistor R and a capacitor C is provided in which R and C are coupled in series between PH and VOUT in a similar manner previously described. The intermediate junction between R and C of the RC circuit 204 is coupled to a positive current sense pin IS+ of a controller 201 which operates in a similar manner as the controller 101 to provide AC and DC compensation as further described herein. The other end of the capacitor C is coupled to a sense resistor RSEN, having its other end coupled to a negative current sense pin IS− of the controller 201. The capacitor C develops a voltage V2 which is sensed by the controller 201 using the sense resistor RSENS.

The controller 201 includes a first amplifier circuit (AMP1) 205 internally coupled to the IS+/− pins for sensing the voltage V2 across the capacitor C. The amplifier circuit 205 develops a sense signal SEN at its output, which is provided to the RC circuit 107 via the SEN pin in a similar manner as previously described. In one embodiment, the SEN signal is provided directly to an input of a second amplifier circuit (AMP2) 207 as a correction signal COR1. In an alternative embodiment, a separate COR1 signal is provided from the RC circuit 107 via a separate COR1 pin which is coupled to the input of the amplifier circuit 207. The alternative configurations are depicted using dashed lines. The RC circuit 109 is shown generically as a resistor R and a capacitor C coupled in parallel between a COR2 pin and RGND in a similar manner as previously described. The COR2 pin/node is further coupled internally to another input of the amplifier circuit 207, which develops the correct sense signal $ISEN_{COR}$ at its output. It is noted that the RC circuit 204 coupled to the inductor L is shown with similar R and C components as the RC circuit 109, where it is understood that the resistances of the resistors R or the capacitances of the capacitors C need not be equal, as long as the time constant R*C is approximately equal for both RC circuits 204 and 109. In one embodiment, the time constant RC of the RC circuits 109 and 204 need not be related to the time constant of the inductor L, or L/DCR. In an alternative embodiment, the time constant R*C of each of the RC circuits 204 and 109 is approximately equal to the time constant L/DCR ($T_{NOM}$) of the inductor L at a particular temperature $T_{NOM}$. The temperature $T_{NOM}$ is selected as any convenient value, such as room temperature or an expected nominal operating temperature or the like.

The time constant of the RC circuit 107 is approximately equal to the time constant L/DCR(T) of the inductor L. The amplifier circuit 205 develops the SEN signal based on the sensed voltage V2 representing the current IL through the inductor L. The amplifier circuit 205 applies the SEN signal to the RC circuit 107 and either the SEN signal or the COR1 signal is adjusted based on temperature. The amplifier circuit 207 applies COR1 (or SEN) as COR2 to the RC circuit 109 and develops the $ISEN_{COR}$ signal. The current sense signal $ISEN_{COR}$ is a corrected sense signal which is temperature-compensated for both AC and DC conditions.

Figure 3:
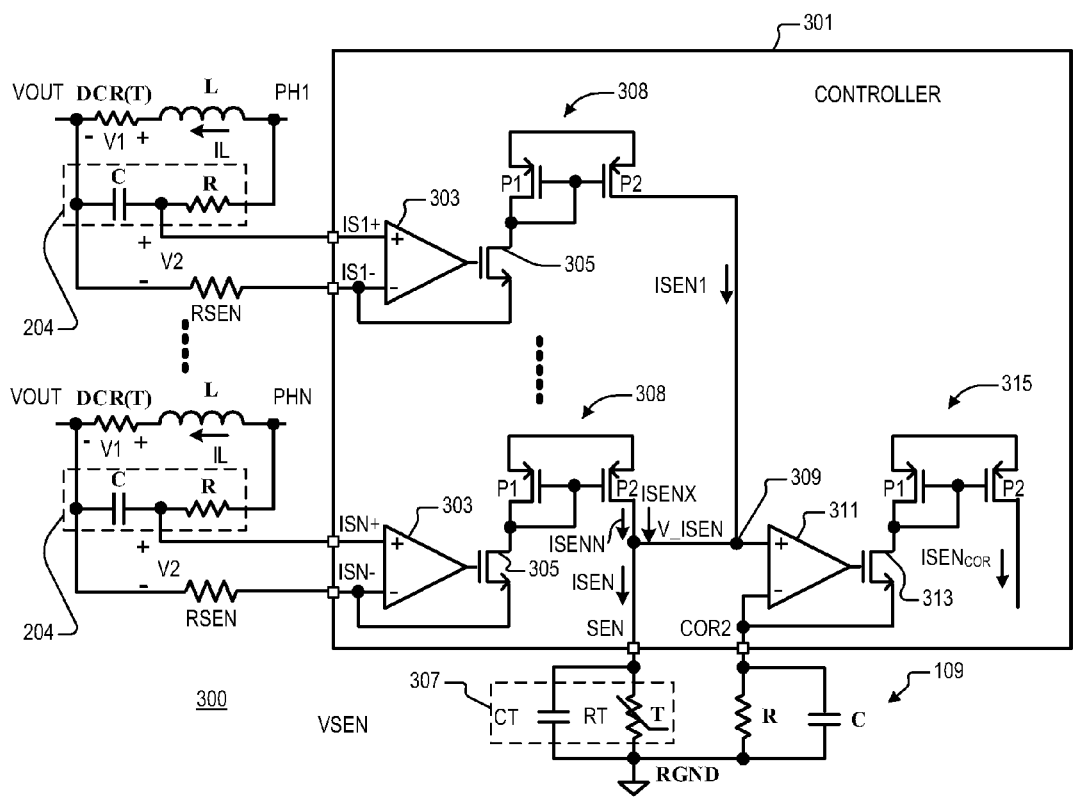
FIG. 3 is a schematic diagram of a voltage regulator circuit including a current sense scheme according to one embodiment to provide both AC and DC temperature compensation in which the sense signal is provided as a current to a temperature coefficient RC circuit.

FIG. 3 is a schematic diagram of a voltage regulator circuit 300 including a current sense scheme according to one embodiment to provide both AC and DC temperature compensation. Each of N phases PH1-PHN is shown generically in a similar manner as shown in FIG. 2. The inherent DC resistance DCR(T) with temperature dependency of the inductor L for each of N phases (in which N is a positive integer) develops a voltage V1 as a function of the inductor current IL in each phase. The RC circuit 204 including the series-coupled resistor R and capacitor C is coupled across the output inductor L in each phase as shown in which the capacitor C develops a voltage V2 in a similar manner as previously described. V2 is equal to V1 if the time constant R*C is equal to L/DCR(T). The resistance value of DCR(T), however, varies with temperature. In the first phase circuit, the junction between R and C is coupled to the IS1+ pin of a controller 301. The other end of the capacitor C is coupled to one end of a sense resistor RSEN, having its other end coupled to the IS1− pin of the controller 301. Each phase circuit is substantially similar except coupled to different current sense pins as shown. For example, the RC circuit 204 and sense resistor RSEN of the last phase circuit N is coupled to current sense pins ISN+ and ISN−.

The voltage V2 of each phase is sensed with a corresponding one of multiple operational amplifiers 303, each having its non-inverting (+) input coupled to the positive current sense pin ISi+ and its inverting (−) input coupled to the negative current sense pin ISi−. An N-channel device 305, such as an N-channel FET or the like, has its gate coupled to the output of the amplifier 303 and its source coupled to the inverting input of the amplifier 303 in each phase. In each phase, the drain of the corresponding device 305 is coupled to the input of a current mirror 308, and each current mirror 308 has its output coupled to a current summing node 309. In the illustrated embodiment, each current mirror is configured with a pair of P-channel devices P1 and P2 with commonly-coupled sources and gates. The gates are further coupled to the drain of P1 at the input of the current mirror 308, in which the drain of P2 forms its output. In operation, the amplifier 303 of each phase circuit has a virtual ground input which effectively places the voltage V2 across RSEN to develop a current ISENi. The amplifier 303 controls the device 305 to sink the current ISENi from the input of the corresponding current mirror 308, which mirrors the current ISENi into the summing node 309. In this manner, a current ISEN1 is developed for phase 1, a current ISEN2 (not shown) is developed for phase 2, and so on up to ISENN for the last phase N. A current ISENX represents any currents from other phases (not shown, e.g., 2, 3, etc.), for a combined current of ISEN. Thus, ISEN=ISEN1+ISEN2+ . . . +ISENN is applied to the summing node 309 from all of the phase circuits. For multiphase applications, ISEN is equal to the sum of all sensed phase current or the average of all sensed phase current.

The summing node 309 is internally coupled to the SEN pin of the controller 301, and an external RC circuit 307 is coupled between the SEN pin and RGND. The RC circuit 307 includes a resistor RT and a capacitor CT coupled in parallel, and summing node 309 develops a sense voltage of V_ISEN in response to the ISEN current flowing into RT and CT via the SEN pin. The summing node 309 is coupled to the non-inverting input of another operational amplifier 311, having its inverting input coupled to the COR2 pin of the controller 301. The RC circuit 109 comprising the resistor R and capacitor C is coupled between the COR2 pin and RGND. An N-channel device 313 is coupled to the amplifier 311 in a similar manner as the device 305 is coupled to the amplifier 303. In particular, the output of the amplifier 311 is coupled to the gate of 313, having its source coupled to the inverting input of the amplifier 311. The drain of device 313 is coupled to the input of a current mirror 315, having an output providing the corrected sense current $ICOR_{SEN}$. The current mirror 315 is configured in substantially the same manner as the current mirror 308 including P-channel devices P1 and P2 coupled to operate in substantially the same manner. In summary, the ISEN current is provided via the SEN pin to the RC circuit 307, which develops the V_ISEN voltage provided to an input of the amplifier 311. In this case, the SEN pin providing the ISEN current operates as the first correction node so that separate pin COR1 is not provided.

The following equation (1) is used to determine the voltage V2 across the capacitor C:

$$V2 = \frac{sL + DCR(T)}{1 + sCR}\left(\frac{V1}{DCR(T)}\right) \quad (1)$$

in which "s" is the Laplace transform complex variable. The voltage V1 across the inherent DC resistance DCR(T) of each inductor L is according to the following equation (2):

$$V1 = DCR(T) * IL \quad (2)$$

In this manner, the voltage V2 may be re-written according to the following equation (3):

$$V2 = \frac{sL + DCR(T)}{1 + sCR}(IL) \quad (3)$$

in which RSEN is the resistance of the sense resistor RSEN. The sense current ISEN1 of the first phase circuit is according to the following equation (4):

$$ISEN1 = \frac{V2}{RSEN} = \frac{sL + DCR(T)}{1 + sRC}\left(\frac{IL}{RSEN}\right) \quad (4)$$

The voltage V_ISEN at summing node 309 is determined according to the following equation (5):

$$V\_ISEN = ISEN\frac{RT}{1 + sRC} = \sum_{i=0}^{N} ISENi\frac{RT}{1 + sRT*CT} \quad (5)$$

where equation (5) may be rewritten according to the following equation (6):

$$V\_ISEN = \frac{sL + DCR(T)}{1 + sRC}\left(\frac{RT}{1 + sRT*CT}\right)\left(\frac{\sum IL}{RSEN}\right) \quad (6)$$

and where equation (6) may be rewritten according to the following equation (7):

$$V\_ISEN = \frac{s\frac{L}{DCR(T)} + 1}{1 + sRC}\left(\frac{DCR(T)*RT}{1 + sRT*CT}\right)\left(\frac{IL_{TOT}}{RSEN}\right) \quad (7)$$

where the load current $IL_{TOT}$ represents the total inductor current of all phases. If the resistor RT is a NTC (negative temperature coefficient) resistor configured to achieve a constant value KT when multiplied by DCR(T) according to the following equation (8):

$$DCR(T)*RT=KT \quad (8)$$

and if RT and CT are according to the following equations (9) and (10):

$$RT*CT = \frac{L}{DCR(T)}, \quad (9)$$

$$CT = \frac{L}{KT} \quad (10)$$

then V_ISEN can be determined according to the following equation (11):

$$V\_ISEN = \frac{KT}{1 + sRC}\left(\frac{IL_{TOT}}{RSEN}\right) \quad (11)$$

CT is selected and RT is configured to meet these conditions. It is noted that the notation "CT" with respect to the capacitor of the RC circuit 307 does not have a temperature dependency but is coupled with RT, which does have the desired temperature dependency. The corrected sense current $ISEN_{COR}$ may be determined according to the following equation (12):

$$ISEN_{COR} = \frac{V\_ISEN}{\left(\frac{R}{1 + sRC}\right)} = \frac{KT}{1 + sRC}\left(\frac{IL_{TOT}}{RSEN}\right)\left(\frac{1 + sRC}{R}\right) = \frac{KT*IL_{TOT}}{R*RSEN} \quad (12)$$

In this manner, the output sense current $ISEN_{COR}$ is not temperature dependent and thus provides both AC and DC temperature compensation. The resistor RT is generally positioned to have substantially the same temperature as the output inductors L, such as being placed adjacent to or sufficiently close to the output inductors L. It is desired that the filter time constant for the SEN pin be equal to or greater than the L/R time constant. Since the time constant RT*CT is equal to L/DCR(T), V_ISEN voltage is used as the sense signal. In this manner, only one extra pin and one RC circuit is needed for this scheme. In one embodiment, the sensed phase current signals of each of the phases, or ISEN1, ISEN2, . . . , ISENN, are used for current balance.

Figure 4:
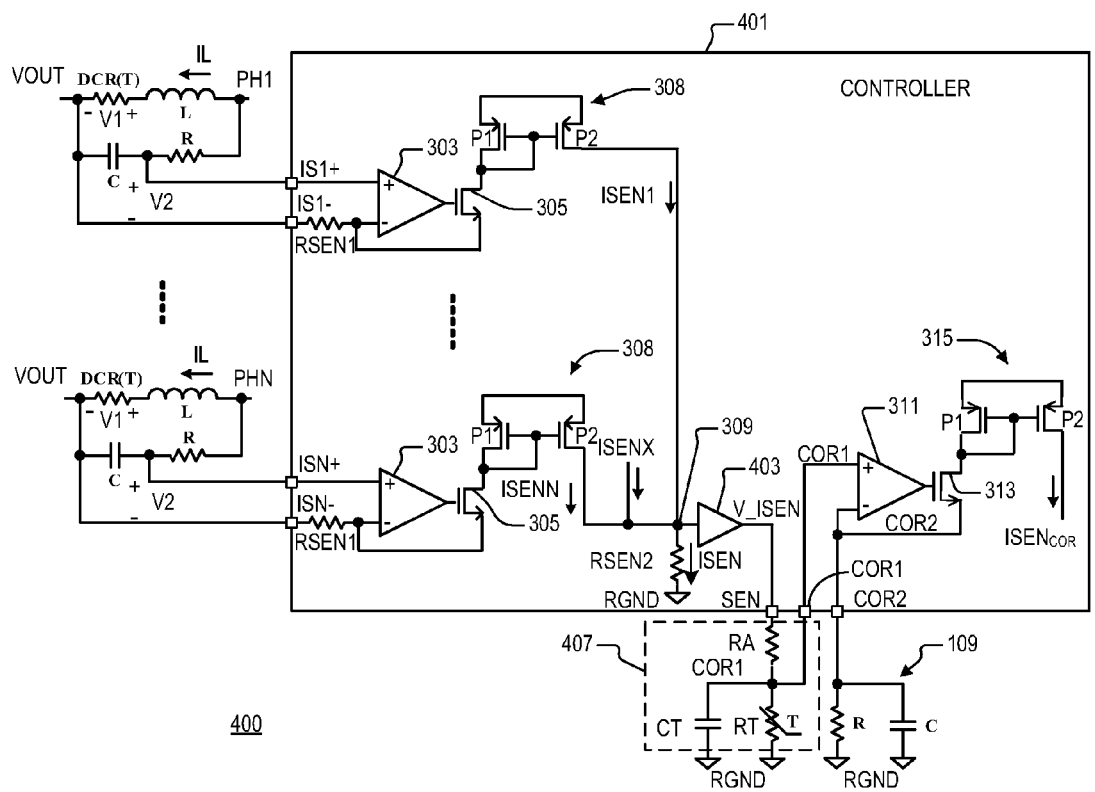
FIG. 4 is a schematic diagram of a voltage regulator circuit including a current sense scheme according to another embodiment to provide both AC and DC temperature compensation in which the sense signal is provided as a voltage applied to a temperature coefficient RC circuit.

FIG. 4 is a schematic diagram of a voltage regulator circuit 400 including a current sense scheme according to another embodiment to provide both AC and DC temperature compensation. The regulator circuit 400 includes a controller 401 and is similar to the regulator circuit 100 except that the external sense resistors RSEN are replaced with internal sense resistors RSEN1 for each phase. The amplifiers 303, the devices 305 and the current mirrors 308 are provided within the controller 401 and operate in similar manner to provide sense currents ISEN1-ISENN from the phases to an internal summing node 309. In this case, however, the summing node 309 is not externally provided but instead is coupled to one end of another internal sense resistor RSEN2, having its other end coupled to RGND. A total sense current ISEN flows through RSEN2 to develop a voltage V_ISEN which is buffered through a separate buffer 403. The summing node 309 is coupled to the input of the buffer 403, having its output providing the voltage V_ISEN to the SEN pin of the controller 401. In this case, the sense signal is a voltage signal rather than a current signal. The external RC circuit 307 is replaced with another external RC circuit 407, which is similar to the RC circuit 307 including RT and CT coupled in parallel between a correction node COR1 and RGND. The RC circuit 407, however, includes another resistor RA coupled between the SEN pin and the correction node COR1. The correction node COR1 is coupled to a COR1 pin of the controller 401, which internally provides a signal COR1 to the non-inverting input of the amplifier 311. The RC circuit 109 is coupled to the COR2 pin which is internally coupled to the inverting input and output of the amplifier 311 in substantially the same manner as previously described. The amplifier 311 controls the device 313 in the same manner for developing the corrected sense current $ISEN_{COR}$ through the mirror circuit 315 in substantially similar manner.

The sense current ISEN1 of the first phase circuit is according to the following equation (13):

$$ISEN1 = \frac{V2}{RSEN1} = \frac{sL + DCR(T)}{1 + sRC}\left(\frac{IL}{RSEN1}\right) \quad (13)$$

The voltage V_ISEN is determined according to the following equation (14):

$$V\_ISEN = ISEN * RSEN2 = \sum_{i=0}^{N} ISENi * RSEN2 \quad (14)$$

where equation (14) may be rewritten according to the following equation (15):

$$V\_ISEN = \frac{sL + DCR(T)}{1 + sRC}\left(\frac{RSEN2}{RSEN1}\right)IL_{TOT} \quad (15)$$

The voltage of COR1 is according to the following equation (16):

$$COR1 = \frac{RT}{RA + RT}\left(\frac{1}{1 + sCT\left(\frac{RA*RT}{RA+RT}\right)}\right)V\_ISEN \quad (16)$$

which may be rewritten according to the following equation (17):

$$COR1 = \frac{sL + DCR(T)}{1 + sRC}\left(\frac{RSEN2}{RSEN1}\right) \quad (17)$$

$$\left(\frac{RT}{RA+RT}\right)\left(\frac{1}{1+sCT\frac{RA*RT}{RA+RT}}\right)IL_{TOT}$$

The corrected sense current $ISEN_{COR}$ may be written according to the following equation (18):

$$ISEN_{COR} = \frac{COR1}{\left(\frac{R}{1+sCR}\right)} \quad (18)$$

which may be written according to the following equation (19):

$$ISEN_{COR} = \frac{sL + DCR(T)}{1 + sCR}\left(\frac{RSEN2}{RSEN2}\right) \quad (19)$$

$$\left(\frac{RT}{RA+RT}\right)\left(\frac{1}{1+sCT\frac{RA*RT}{RA+RT}}\right)\left(\frac{1+sCR}{R}\right)IL_{TOT}$$

which is rewritten according to the following equation (20):

$$ISEN_{COR} = \frac{\left(\frac{sL}{DCR(T)}\right)+1}{1+sCR}\left(\frac{RSEN2}{RSEN1}\right) \quad (20)$$

$$\left(\frac{RT}{RA+RT}\right)\left(\frac{DCR(T)}{1+sCT\left(\frac{RA*RT}{RA+RT}\right)}\right)\left(\frac{1+sCR}{R}\right)IL_{TOT}$$

If $DCR(T)*RT/(RA+RT)=KT$, where KT is a constant, and if $CT=L/(RA*KT)$, then $ISEN_{COR}$ may be written according to the following equation (21):

$$ISEN_{COR} = \frac{RSEN2}{RSEN1}\left(\frac{KT}{R}\right)IL_{TOT} \quad (21)$$

RA and CT are selected and RT is configured to meet these conditions. It is noted that the timing constant for the RC circuit 407 as compared to the timing constant of the output inductor L may be written according to the following equation (22):

$$\frac{L}{DCR(T)} = \frac{RA*RT*CT}{(RA+RT)} \quad (22)$$

In a similar manner as with the voltage regulator circuit 300, the output sense current $ISEN_{COR}$ for the regulator circuit 400 is not temperature dependent and provides both AC and DC temperature compensation.

Figure 5:
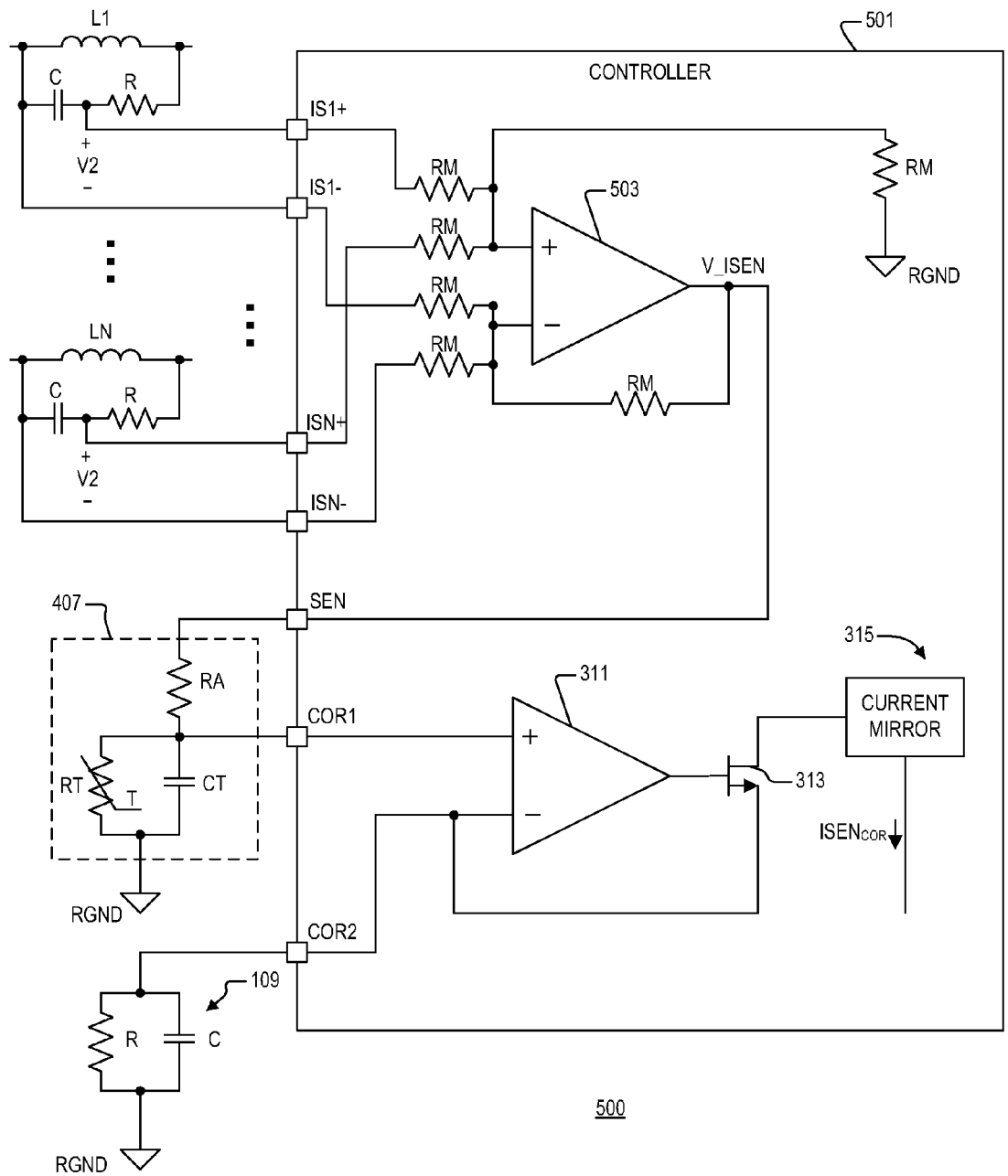
FIG. 5 is a schematic diagram of a portion of a voltage regulator circuit including a current sense scheme according to yet another embodiment to provide both AC and DC temperature compensation similar to that shown in FIG. 4 yet using a single summing amplifier.

FIG. 5 is a schematic diagram of a portion of a voltage regulator circuit 500 including a current sense scheme according to yet another embodiment to provide both AC and DC temperature compensation. The regulator circuit 500 includes a controller 501 which uses a voltage adder and internal current sense resistors RM. The regulator circuit 500 is shown with N phases in which the controller senses the voltage across the capacitor C via corresponding ISi+/− pins in a similar manner as previously described. Each ISi+/− signal pair is provided through a pair of matching resistors RM to respective inputs of a differential amplifier 503, having an output coupled to a SEN pin. The SEN pin is externally coupled to the RC circuit 407 in substantially the same manner as for the controller 401. The RC circuit 407 develops a signal COR1 provided through the COR1 pin of the controller 501 to the non-inverting input of the amplifier 311. The RC circuit 109 is coupled to the COR2 pin in the same manner, where COR2 is provided to the inverting input of the amplifier 311. The device 313 and the current mirror 315 are coupled to the amplifier 311 to develop the corrected sense current $ISEN_{COR}$ in similar manner as previously described.

It is assumed that the output inductors L of each phase are substantially similar, that each has equivalent DCR and inductance L and carries an inductor current IL, that the resistors RM are matched and that the summing amplifier 503 has a gain of 1. The voltage V_ISEN at the output of the amplifier 503 (summing node) and provided on the SEN pin is determined according to the following equation (23):

$$V\_ISEN = \sum IL\left(\frac{DCR(T) + sL}{sCR + 1}\right) \quad (23)$$

The voltage on the COR1 pin is determined according to the following equation (24):

$$COR1 = V\_ISEN\left(\frac{RT}{RA+RT}\right)\left(\frac{1}{s(RT//RA)CT+1}\right) \quad (24)$$

in which the notation "//" is shorthand for the parallel equivalent of the indicated resistors RA and RT. Equation (24) is rewritten by substituting in equation (23) according to the following equation (25):

$$COR1 = \frac{RT}{RA+RT}\left(\frac{RT}{RA+RT}\right) \quad (25)$$

$$\left(\frac{1}{s(RT//RA)CT+1}\right)\sum IL\left(\frac{DCR(T)+sL}{sCR+1}\right)$$

The DC gain of equation (25), denoted $COR1_{DC}$, is obtained by assuming that s is zero according to the following equation (26):

$$COR1_{DC} = \frac{RT*DCR(T)}{RA+RT}\sum IL \quad (26)$$

Again, RT and RA are configured such that DCR(T)*RT/(RA+RT)=KT, where KT is a constant. Furthermore, the RC time constant formed by CT and (RT//RA) is according to the following equation (27):

$$\frac{RT}{RA+RT}RA*CT = \frac{KT}{DCR(T)}RA*CT \quad (27)$$

In one embodiment, RA is a 1% tolerance resistor and CT is a 10% tolerance capacitor. The time constant can be made to matching the time constant of inductor L/DCR(T) as both of them are inversely proportional to DCR(T), which changes with temperature. The impedance on the inverse side of the amplifier 311 is according to the following equation (28):

$$\frac{R/sC}{R+1/sC} = \frac{R}{sCR+1} \quad (28)$$

The corrected sense current $ISEN_{COR}$ is equal to the COR1 voltage divided by this impedance, which is determined according to the following equation (29):

$$ISEN_{COR} = \frac{RT}{RA+RT}\left(\frac{1}{s(RT//RA)CT+1}\right) \quad (29)$$

$$\left(\frac{sCR+1}{R}\right)\sum IL\left(\frac{DCR(T)+sL}{sCR+1}\right)$$

which is rewritten according to the following equation (30):

$$ISEN_{COR} = KT\left(\frac{1}{s\frac{KT}{DCR(T)}CT+1}\right) \quad (30)$$

$$\left(\frac{1}{R}\right)\left(1+\frac{L}{DCR(T)}\right)\sum IL = \frac{KT}{R}\sum IL$$

In this manner, $ISEN_{COR}$ is proportional to the inductor current summation with all the other time constants and DCR (T) temperature variations canceled. In one embodiment, the voltage between ISi+ and ISi− of each phase is used for current balance purposes. The controller 501 provides the benefit of having only one summing amplifier for all phases rather than a separate amplifier for each phase.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing out the same purposes of the present invention without departing from the spirit and scope of the invention as defined by the following claims.

The invention claimed is:

1. A current sensing circuit with AC and DC temperature compensation for sensing current through an output inductor of a voltage regulator, the output inductor comprising an inherent DC resistor having a resistance as a function of temperature, the current sensing circuit comprising:

a first RC circuit comprising a first resistor and a first capacitor coupled in series across the output inductor, said first RC circuit having a first time constant;

a first amplifier circuit having an input coupled across said first capacitor and an output providing a sense signal;

a second RC circuit receiving said sense signal, wherein said second RC circuit comprises a second resistor and a second capacitor coupled in parallel between a first correction node and a reference node, wherein said second resistor has a resistance as a function of temperature so that said second RC circuit has a second time constant which is approximately equal to a time constant of the output inductor as a function of temperature;

a third RC circuit having a third resistor and a third capacitor coupled in parallel between a second correction node and said reference node, wherein a resistance of said third resistor times a capacitance of said third capacitor is approximately equal to a resistance of said first resistor times a capacitance of said first capacitor; and a second amplifier circuit having first and second inputs coupled to said first and second correction nodes, respectively, and an output providing a corrected sense signal.

2. The current sensing circuit of claim 1, wherein said first amplifier circuit comprises:

a sense resistor having first and second ends in which said first end is coupled to said first capacitor;

a differential amplifier having a first input coupled to a junction between said first resistor and said first capacitor, a second input coupled to said second end of said sense resistor, and an output;

a transistor device having a control terminal and first and second current terminals, wherein said control terminal is coupled to said output of said differential amplifier and wherein said first current terminal is coupled to said second input of said differential amplifier; and a current mirror having an input coupled to said second current terminal of said transistor device and an output providing said sense signal as a sense current to said first correction node.

3. The current sensing circuit of claim 1, wherein said first amplifier circuit comprises:

a first sense resistor having first and second ends in which said first end is coupled to said first capacitor;

a differential amplifier having a first input coupled to a junction between said first resistor and said first capacitor, a second input coupled to said second end of said first sense resistor, and an output;

a transistor device having a control terminal and first and second current terminals, wherein said control terminal is coupled to said output of said differential amplifier and wherein said first current terminal is coupled to said second input of said differential amplifier;

a current mirror having an input coupled to said second current terminal of said transistor device and an output providing a sense current;

a second sense resistor having a first end coupled to said output of said current mirror and a second end coupled to said reference node; and a buffer having an input coupled to said first end of said second sense resistor and an output providing said sense signal as a sense voltage.

4. The current sensing circuit of claim 1, wherein said first amplifier circuit comprises:

a first sense resistor having a first end and having a second end for coupling to a junction between said first resistor and said first capacitor of said first RC circuit;

a second sense resistor having a first end coupled to said first end of said first sense resistor and a second end coupled to said reference node;

a third sense resistor having first and second ends in which said first end is for coupling to one end of the output inductor;

a differential amplifier having a first input coupled to said first end of said first sense resistor, a second input coupled to said second end of said third sense resistor, and an output providing said sense signal as a sense voltage; and a fourth sense resistor having a first end coupled to said second input of said differential amplifier and a second end coupled to said output of said differential amplifier.

5. The current sensing circuit of claim 1, wherein a resistance of said second resistor times a capacitance of said second capacitor over temperature is approximately equal to an inductance of the output inductor divided by the resistance of the inherent DC resistor of the output inductor.

6. The current sensing circuit of claim 1, wherein said second RC circuit further comprises:

a fourth resistor coupled between said output of said first amplifier circuit and said first correction node; and wherein a resistance of said second resistor times a capacitance of said second capacitor over temperature is approximately equal to an inductance of the output inductor times a sum of resistances of said second and fourth resistors divided by said resistance of said fourth resistor and further divided by the resistance of the inherent DC resistor of the output inductor.

7. The current sensing circuit of claim 1, wherein said second amplifier circuit comprises:

a differential amplifier having a first input coupled to said first correction node, a second input coupled to said second correction node, and an output;

a transistor device having a control terminal and first and second current terminals, wherein said control terminal is coupled to said output of said differential amplifier and wherein said first current terminal is coupled to said second correction node; and a current mirror having an input coupled to said second current terminal of said transistor device and an output providing said corrected sense signal as a corrected sense current.

8. The current sensing circuit of claim 1, wherein said first and second amplifier circuits are provided on a controller chip.

9. The current sensing circuit of claim 8, wherein said controller chip has a pin providing said sense signal as a sense current from said first amplifier circuit.

10. The current sensing circuit of claim 8, wherein said controller chip has a first pin providing said sense signal as a sense voltage from said first amplifier circuit and a second pin for coupling to said first correction node.

11. A current sensing circuit with AC and DC temperature compensation for sensing current through a plurality of output inductors of a multiphase voltage regulator, each output inductor comprising an inherent DC resistor having a resistance as a function of temperature, the current sensing circuit comprising:

a plurality of first RC circuits, each comprising a first resistor and a first capacitor coupled in series across a corresponding one of the plurality of output inductors, each said first RC circuit having a first time constant;

at least one first amplifier circuit having a plurality of inputs and at least one output, wherein each said input is coupled across said first capacitor of a corresponding one of said plurality of first RC circuits, and wherein said at least one output provides a sense signal;
a second RC circuit receiving said sense signal, wherein said second RC circuit comprises a second resistor and a second capacitor coupled in parallel between a first correction node and a reference node, wherein said second resistor has a resistance as a function of temperature so that said second RC circuit has a second time constant which is approximately equal to a time constant of each output inductor as a function of temperature;
a third RC circuit having a third resistor and a third capacitor coupled in parallel between a second correction node and said reference node, wherein a resistance of said third resistor times a capacitance of said third capacitor is approximately equal to a resistance of said first resistor times a capacitance of said first capacitor of each of said plurality of first RC circuits; and
a second amplifier circuit having first and second inputs coupled to said first and second correction nodes, respectively, and an output providing a corrected sense signal.

12. The current sensing circuit of claim 11, wherein said at least one first amplifier circuit comprises a plurality of first amplifier circuits, each comprising:
a sense resistor having first and second ends in which said first end is coupled to said first capacitor of a corresponding one of said plurality of first RC circuits;
a differential amplifier having a first input coupled to a junction between said first resistor and said first capacitor of a corresponding one of said plurality of first RC circuits, a second input coupled to said second end of said sense resistor, and an output;
a transistor device having a control terminal and first and second current terminals, wherein said control terminal is coupled to said output of said differential amplifier and wherein said first current terminal is coupled to said second input of said differential amplifier; and
a current mirror having an input coupled to said second current terminal of said transistor device and an output providing said sense signal as a sense current to said first correction node.

13. The current sensing circuit of claim 11, wherein said at least one first amplifier circuit comprises:
a plurality of first sense resistors, each having first and second ends in which said first end is coupled to said first capacitor of a corresponding one of said plurality of first RC circuits;
a plurality of differential amplifiers, each having a first input coupled to a junction between said first resistor and said first capacitor of a corresponding one of said plurality of first RC circuits, a second input coupled to said second end of a corresponding one of said plurality of first sense resistors, and an output;
a plurality of transistor devices, each having a control terminal and first and second current terminals, wherein said control terminal is coupled to said output of a corresponding one of said plurality of differential amplifiers and wherein said first current terminal is coupled to said second input of said corresponding differential amplifier;
a plurality of current mirrors, each having an input coupled to said second current terminal of a corresponding one of said plurality of transistor devices and an output providing a sense current;
a second sense resistor having a first end coupled to said output of each of said plurality of current mirrors and a second end coupled to said reference node; and
a buffer having an input coupled to said first end of said second sense resistor and an output providing said sense signal as a sense voltage.

14. The current sensing circuit of claim 11, wherein said at least one first amplifier circuit comprises:
a plurality of first sense resistors, each having a first end and a second end for coupling to a junction between said first resistor and said first capacitor of a corresponding one of said plurality of first RC circuits;
a second sense resistor having a first end coupled to said first end of each of said plurality of first sense resistors and a second end coupled to said reference node;
a plurality of third sense resistors, each having first and second ends in which said first end is for coupling to one end of a corresponding output inductor;
a differential amplifier having a first input coupled to said first end of said second sense resistor, a second input coupled to said second end of each of said plurality of third sense resistors, and an output providing said sense signal as a sense voltage; and
a fourth sense resistor having a first end coupled to said second input of said differential amplifier and a second end coupled to said output of said differential amplifier.

15. The current sensing circuit of claim 11, wherein a resistance of said second resistor times a capacitance of said second capacitor over temperature is approximately equal to an inductance of each output inductor divided by the resistance of the inherent DC resistor of each output inductor.

16. The current sensing circuit of claim 11, wherein said second RC circuit further comprises:
a fourth resistor coupled between said at least one output of said at least one first amplifier circuit and said first correction node; and
wherein a resistance of said second resistor times a capacitance of said second capacitor over temperature is approximately equal to an inductance of each output inductor times a sum of resistances of said second and fourth resistors divided by said resistance of said fourth resistor and further divided by the resistance of the inherent DC resistor of each output inductor.

17. The current sensing circuit of claim 11, wherein said second amplifier circuit comprises:
a differential amplifier having a first input coupled to said first correction node, a second input coupled to said second correction node, and an output;
a transistor device having a control terminal and first and second current terminals, wherein said control terminal is coupled to said output of said differential amplifier and wherein said first current terminal is coupled to said second correction node; and
a current mirror having an input coupled to said second current terminal of said transistor device and an output providing said corrected sense signal as a corrected sense current.

18. The current sensing circuit of claim 1, wherein said at least one first amplifier circuit and second amplifier circuit are provided on a controller chip.

19. A method of sensing current with AC and DC temperature compensation of a voltage converter comprising at least one output inductor having an inherent DC resistor with a resistance as a function of temperature, said method comprising:
coupling a first RC circuit comprising a first resistor and a first capacitor in series across the output inductor;
sensing voltage across the first capacitor and converting to a sense signal;

applying the sense signal to a second RC circuit which comprises a second resistor and a second capacitor coupled in parallel between a first correction node and a reference node, wherein the second resistor comprises a resistance as a function of temperature and wherein the second RC circuit has a time constant which is approximately equal to a time constant of the output inductor as a function of temperature;

coupling a third RC circuit comprising a third resistor and a third capacitor in parallel between a second correction node and the reference node, wherein a resistance of said third resistor times a capacitance of said third capacitor is approximately equal to a resistance of said first resistor times a capacitance of the first capacitor; and applying voltage of the first correction node to the second correction node and converting to a correction sense signal.

20. The method of claim 19, wherein said converting to a sense signal comprises converting to a sense current and wherein said applying comprises applying the sense current to the second RC circuit.

21. The method of claim 19, wherein said converting to a sense signal comprises converting to a sense voltage and wherein said applying comprises applying the sense voltage to a first end of a fourth resistor having a second end coupled to the first correction node.

* * * * *